(12) United States Patent
Jin et al.

(10) Patent No.: US 10,950,525 B2
(45) Date of Patent: Mar. 16, 2021

(54) FABRICATION METHOD OF PACKAGING STRUCTURE

(71) Applicants: Semiconductor Manufacturing International (Shanghai) Corporation, Shanghai (CN); Semiconductor Manufacturing International (Beijing) Corporation, Beijing (CN)

(72) Inventors: Li Zhong Jin, Shanghai (CN); Li Hui Lu, Shanghai (CN); Chun Chao Fei, Shanghai (CN); Po Yuan Chiang, Shanghai (CN); Ya Ping Wang, Shanghai (CN)

(73) Assignees: Semiconductor Manufacturing International (Shanghai) Corporation, Shanghai (CN); Semiconductor Manufacturing International (Beijing) Corporation, Beijing (CN)

(*) Notice: Subject to any disclaimer, the term of this patent is extended or adjusted under 35 U.S.C. 154(b) by 0 days.

(21) Appl. No.: 16/558,555

(22) Filed: Sep. 3, 2019

(65) Prior Publication Data
US 2019/0393134 A1 Dec. 26, 2019

Related U.S. Application Data

(62) Division of application No. 15/851,007, filed on Dec. 21, 2017, now Pat. No. 10,446,474.

(30) Foreign Application Priority Data

Dec. 22, 2016 (CN) .......................... 201611198710.5

(51) Int. Cl.
*H01L 21/02* (2006.01)
*H01L 23/49* (2006.01)
(Continued)

(52) U.S. Cl.
CPC ........ *H01L 23/49* (2013.01); *H01L 21/02123* (2013.01); *H01L 23/485* (2013.01);
(Continued)

(58) Field of Classification Search
CPC . H01L 21/02123; H01L 23/485; H01L 24/03; H01L 24/05
See application file for complete search history.

(56) References Cited

U.S. PATENT DOCUMENTS

2009/0098687 A1 4/2009 Antol et al.
2015/0194395 A1 7/2015 Safai et al.
(Continued)

FOREIGN PATENT DOCUMENTS

| CN | 102956602 A | 3/2013 |
|----|-------------|--------|
| CN | 103117265 A | 5/2013 |
| CN | 103311212 A | 9/2013 |

OTHER PUBLICATIONS

The European Patent Office (EPO) The Extended European Search Report for 17207917.0 dated May 18, 2018 14 Pages.

*Primary Examiner* — Elias Ullah
(74) *Attorney, Agent, or Firm* — Anova Law Group, PLLC (57) ABSTRACT

Method for fabricating A packaging structure is provided. The packaging structure includes a base substrate including a solder pad body region and a trench region adjacent to and around the solder pad body region. The packaging structure includes a passivation layer on the base substrate and exposing the solder pad body region and the trench region. The packaging structure includes a main body solder pad on the solder pad body region of the base substrate, and one or more trenches on the trench region of the base substrate and between the passivation layer and the main body solder pad.

(Continued)

The packaging structure includes a bonding conductive wire having one end connected to the main body solder pad.

19 Claims, 7 Drawing Sheets

(51) Int. Cl.
*H01L 23/00* (2006.01)
*H01L 23/485* (2006.01)
(52) U.S. Cl.
CPC .............. *H01L 24/03* (2013.01); *H01L 24/05* (2013.01); *H01L 24/48* (2013.01); *H01L 24/45* (2013.01); *H01L 24/85* (2013.01); *H01L 2224/02166* (2013.01); *H01L 2224/0345* (2013.01); *H01L 2224/0361* (2013.01); *H01L 2224/05098* (2013.01); *H01L 2224/05166* (2013.01); *H01L 2224/05181* (2013.01); *H01L 2224/05552* (2013.01); *H01L 2224/05553* (2013.01); *H01L 2224/05554* (2013.01); *H01L 2224/05555* (2013.01); *H01L 2224/05557* (2013.01); *H01L 2224/05558* (2013.01); *H01L 2224/05624* (2013.01); *H01L 2224/45124* (2013.01); *H01L 2224/45139* (2013.01); *H01L 2224/45144* (2013.01); *H01L 2224/45147* (2013.01); *H01L 2224/45184* (2013.01); *H01L 2224/48463* (2013.01); *H01L 2924/1032* (2013.01); *H01L 2924/1033* (2013.01); *H01L 2924/10252* (2013.01); *H01L 2924/10253* (2013.01); *H01L 2924/10271* (2013.01); *H01L 2924/10272* (2013.01); *H01L 2924/10329* (2013.01)

(56) References Cited

U.S. PATENT DOCUMENTS

2015/0194396 A1   7/2015  Safai et al.
2016/0028368 A1   1/2016  Shealy

Figure 13

FABRICATION METHOD OF PACKAGING STRUCTURE

CROSS-REFERENCES TO RELATED APPLICATIONS

This application is a divisional of U.S. patent application Ser. No. 15/851,007, filed on Dec. 21, 2017, which claims the priority of Chinese patent application No. 201611198710.5, filed on Dec. 22, 2016, the entirety of which is incorporated herein by reference.

FIELD OF THE DISCLOSURE

The present disclosure generally relates to the field of semiconductor manufacturing and, more particularly, relates to fabrication method of packaging structures.

BACKGROUND

Wiring packaging is an important step in an integrated circuit chip packaging process. The wiring packaging is capable of electrically connecting a bonding pad on the chip to an inner pin on a conductive rack, such that an electrical signal can be transmitted from the integrated circuit to the external circuit.

The wiring packaging usually uses an electronic image processing technique to determine the position of each contact point on the chip as well as the position of contact point on the inner pin corresponding to each contact point on the chip, after the conductive rack is transferred from a magazine to a locator. Then a wire bonding step is performed. When performing the wire bonding, the contact point on the chip is a first solder joint, and the contact point on the inner pin on the conductive rack is a second solder joint. The wire bonding step includes: sintering one end of a lead wire into a small ball by using a welding equipment; pressure-welding the small ball onto the first solder joint; pulling the lead wire by following a preset path; pressure-welding the other end of the lead wire onto the second solder joint; and pulling off the lead wire between the second solder joint and the welding equipment.

However, the performance of the conventional packaging structure is poor and still needs to be improved. The disclosed device structures and methods are directed to solve one or more problems set forth above and other problems in the art.

BRIEF SUMMARY OF THE DISCLOSURE

One aspect of the present disclosure includes a packaging structure. The packaging structure includes a base substrate including a solder pad body region and a trench region adjacent to and around the solder pad body region. The packaging structure also includes a passivation layer on a surface of the base substrate and exposing the solder pad body region and the trench region. In addition, the packaging structure includes a main body solder pad on the solder pad body region of the base substrate, and one or more trenches on the trench region of the base substrate and between the passivation layer and the main body solder pad. Further, the packaging structure includes a bonding conductive wire having one end connected to the main body solder pad.

Another aspect of the present disclosure includes a method for fabricating a packaging structure. The method includes providing a base substrate, and obtaining a solder pad body region and a trench region adjacent to and around the solder pad body region, on a surface of the base substrate. The method also includes forming a passivation layer on the surface of the base substrate and exposing the solder pad body region and the trench region. In addition, the method includes forming a main body solder pad on the solder pad body region of the base substrate, and forming one or more trenches, on the trench region of the base substrate and between the passivation layer and the main body solder pad. Further, the method includes forming a bonding conductive wire having one end connected to the main body solder pad, by a wire bonding process.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or the alike parts.

Figure 1:
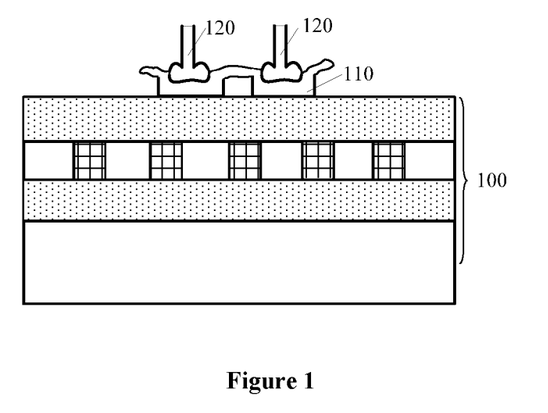
FIG. 1 illustrates a schematic diagram of a packaging structure.

FIG. 1 illustrates a schematic diagram of a packaging structure. Referring to FIG. 1, the packaging structure includes a base substrate 100 including a plurality of solder pad regions; solder pads 110 formed on the base substrate 100 in the solder pad regions, respectively; and bonding conductive wires 120. One end of each bonding conductive wire 120 is connected to each solder pad 110.

However, in the above-described packaging structure, a short-circuit phenomenon easily occurs between the adjacent solder pads. The solder pad 110 is made of aluminum, and the bonding conductive wire 120 is made of copper. A wire bonding process is performed when connecting the bonding conductive wire 120 and the solder pad 110. Because a hardness of the bonding conducting wire 120 is large, the energy required for the wire bonding process is large, such that the solder pad 110 is subjected to a large force during the wire bonding process. While a hardness of the solder pad 110 is small, the solder pad 110 is prone to have a large deformation and extends to surrounding devices during the wire bonding process, thus the solder pad 110 and the surrounding devices are connected together.

Figure 12:
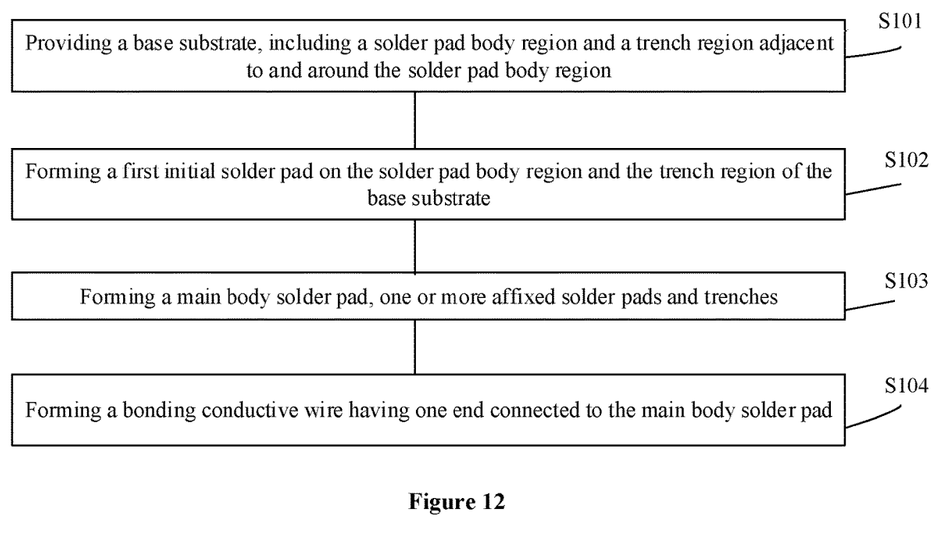
FIG. 12 illustrates an exemplary fabrication method for forming a packaging structure consistent with various disclosed embodiments of the present disclosure.

The present disclosure provides a packaging structure and fabrication method thereof. FIG. 12 illustrates an exemplary fabrication method for forming a packaging structure consistent with various disclosed embodiments of the present disclosure; and FIGS. 2-6 illustrate schematic diagrams of semiconductor structures corresponding to certain stages of the exemplary fabrication method.

Figure 2:
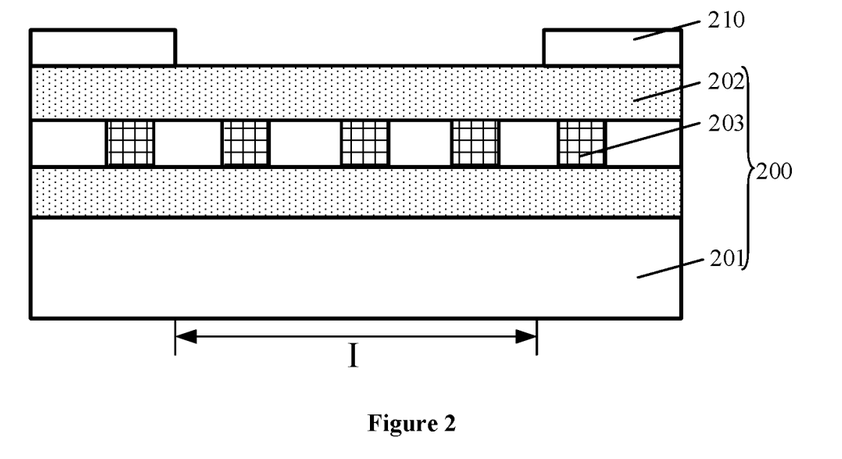
FIGS. 2-6 illustrate schematic diagrams of semiconductor structures corresponding to certain stages of an exemplary fabrication method for forming a packaging structure consistent with various disclosed embodiments of the present disclosure.
Figure 3:
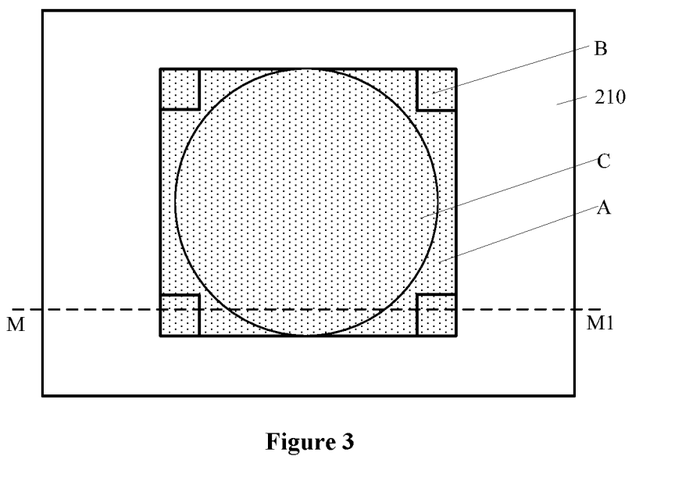

As shown in FIG. 12, at the beginning of the fabrication method, a base substrate with certain structures may be provided (S101). FIGS. 2-3 illustrate a schematic diagram of corresponding semiconductor structures.

FIG. 3 illustrates a top-view of a solder pad region I facing toward a top interconnection layer, and FIG. 2 illustrates a cross-sectional view along a line 'MM1' in FIG. 3. Referring to FIGS. 2-3, a base substrate 200 may be provided. The base substrate 200 may include a semiconductor substrate 201; a semiconductor device (not illustrated) inside the semiconductor substrate 201 or on a surface of the semiconductor substrate 201; an electrical interconnection structure 202 connected to the semiconductor device; and an insulating dielectric layer formed on the semiconductor substrate 201 and on the semiconductor device. The electrical interconnection structure 202 may be formed within the insulating dielectric layer.

In one embodiment, the semiconductor substrate 201 may be a silicon substrate, a germanium substrate, a silicon germanium substrate, a silicon carbide substrate, a silicon on insulator (SOI) substrate, a germanium on insulator (GOI) substrate, a glass substrate, or Group III-V compounds substrates, such as a gallium nitride substrate, or a gallium arsenide substrate, etc. The semiconductor device may include a CMOS device. The CMOS device may include a transistor, a memory, a capacitor, or a resistor, etc. The insulating dielectric layer may be made of silicon oxide, silicon oxynitride, silicon carbonitride, or silicon nitride, etc. In one embodiment, the semiconductor substrate 201 may be a silicon substrate, and the semiconductor device may include a transistor.

In one embodiment, the electrical interconnection structure 202 may include a top interconnection layer and a bottom interconnection layer below the top interconnection layer. The bottom interconnection layer may include one or more layers of bottom interconnection sublayer. Connection keys 203 may connect the top interconnection layer and the bottom interconnection layer, the plurality of layers of the bottom interconnection sublayer, and the bottom interconnection sublayer and the semiconductor device.

The electrical interconnection structure 202 and the connection keys 203 may be made of a metal material, such as copper or aluminum, etc. In one embodiment, a surface of the top interconnection layer may be a surface of the solder pad region I of the base substrate 200. The solder pad region I of the base substrate 200 may have a surface shape including one of a rectangular shape, a square shape, a circular shape, a triangular shape, and an irregular shape.

In one embodiment, the solder pad region I of the base substrate 200 may have a rectangular surface shape. For example, the rectangular surface may include two first sides facing toward each other and two second sides facing toward each other. The second sides may be connected to the first sides, respectively.

Referring to FIG. 3, a solder pad body region A and a trench region B on the surface of the base substrate 200 may be obtained. The trench region B may be around and adjacent to the solder pad body region A.

The base substrate 200 may include one or more solder pad regions I. Each solder pad region I may include one solder pad body region A and one or more trench regions B around the solder pad body region A.

In certain embodiments, the base substrate may include one or more solder pad regions I. Each solder pad region I may include the solder pad body region. The trench region may be around the solder pad region.

The solder pad body region A may include a contact region C. One end of a subsequently formed bonding conductive wire connected to a main body solder pad on the base substrate 200 may be in the contact region C.

The contact region C may be the designed largest area in the process design where the main body solder pad is in contact with the bonding conductive wire. In the actual process, the area where the main body solder pad is in contact with the bonding conductive wire may be within the contact region or may be overlap with the contact region.

In one embodiment, a process for obtaining the solder pad body region A and the trench region B on the surface of the base substrate 200 may include: setting the contact region C in the solder pad region I of the base substrate 200; setting the trench region B in the solder pad region I outside of the contact region C (illustrated in FIG. 3); and setting the solder pad region I outside of the trench region B as the solder pad body region A (illustrated in FIG. 3).

In one embodiment, the contact region C of the base substrate 200 may have a circular surface shape. The surface of the contact region C of the base substrate 200 may be tangent to the first sides or the second sides.

In one embodiment, the contact region C and the trench region B may be spaced apart by a minimum distance. The minimum distance may be in a range of approximately 1 μm-2 μm. In this case, when the area where the subsequently formed main body solder pad is in contact with the bonding conductive wire is overlap with the contact region, the accuracy requirements of the subsequent wire bonding process may be reduced. The trench region B may have a large space for accommodating extended portion of the main body solder pad due to deformation of the main body solder pad.

In one embodiment, before subsequently forming the main body solder pad, a passivation layer 210 may be formed on the surface of the base substrate 200. The passivation layer 210 may expose the solder pad body region A and the trench region B on the surface of the base substrate 200. For example, the passivation layer 210 may expose the surface of the top interconnection layer in the solder pad region I.

In one embodiment, the passivation layer 210 may be a single-layer structure. The passivation layer 210 may be made of silicon dioxide, silicon nitride, or polyimide, etc.

In another embodiment, the passivation layer 210 may be a multi-layer structure. The passivation layer 210 may include a first passivation layer and a second passivation layer on the first passivation layer. The first passivation layer may be made of silicon dioxide, or silicon nitride, etc. The second passivation layer may be made of polyimide.

The main body solder pad may be formed on the solder pad body region A of the base substrate 200. One or more trenches may be formed in the trench region B while forming the main body solder pad. Each trench may be formed between the passivation layer 210 and the main body solder pad. In one embodiment, the bottom surface of the trench on the base substrate 200 may be coplanar with the top surface of the solder pad body region A of the base substrate 200.

In one embodiment, one or more affixed solder pads may be formed when forming the main body solder pad and the one or more trenches. The affixed solder pads may be formed at the bottom of the one or more trenches on the base substrate 200. The surface of each affixed solder pad may be lower than the top surface of the main body solder pad.

Figure 4:
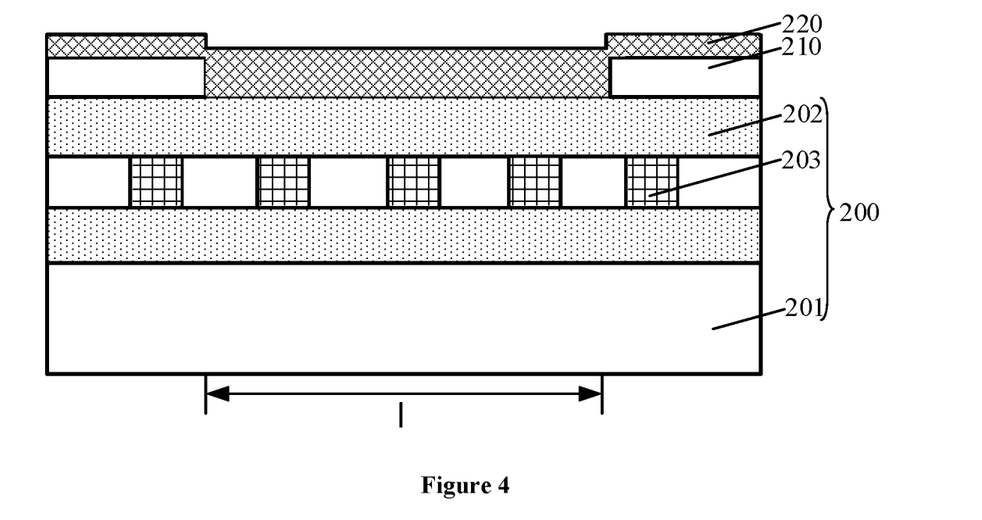

Returning to FIG. 12, after providing the base substrate, a first initial solder pad may be formed (S102). FIG. 4 illustrates a schematic diagram of corresponding semiconductor structures.

Referring to FIG. 4, a first initial solder pad 220 may be formed on the solder pad body region A and the trench region B of the base substrate 200. In one embodiment, the first initial solder pad 220 may also be formed on the base substrate 200 around the solder pad body region A and the trench region B.

The first initial solder pad 220 may be used to form a main body solder pad and the one or more affixed solder pads. The first initial solder pad 220 may be made of a metal material, such as aluminum. A process for forming the first initial solder pad 220 may include a deposition process, such as a sputtering process.

Before forming the first initial solder pad 220, an isolation layer (not illustrated) may be formed on the solder pad body region A and the trench region B of the base substrate. In certain embodiments, the isolation layer may not be formed.

In one embodiment, the isolation layer may be a multi-layer structure. For example, the isolation layer may include a bottom isolation layer and a top isolation layer formed on the bottom isolation layer. The bottom isolation layer may be made of tantalum nitride, and the top isolation layer may be made of tantalum. In another embodiment, the bottom isolation layer may be made of titanium nitride, and the top isolation layer may be made of titanium. In certain embodiments, the isolation layer may be a single-layer structure. The isolation layer may be made of tantalum nitride, tantalum, titanium nitride, or titanium, etc.

In one embodiment, a thickness of the isolation layer may be in a range of approximately 50 nm-150 nm. The isolation layer may be used to isolate the top interconnection layer in the solder pad region I and the first initial solder pad 220. Therefore, atoms in the subsequently formed main body solder pad and affixed solder pads may not diffuse into the top interconnection layer, to avoid affecting the electrical performance of the top interconnection layer.

Figure 5:
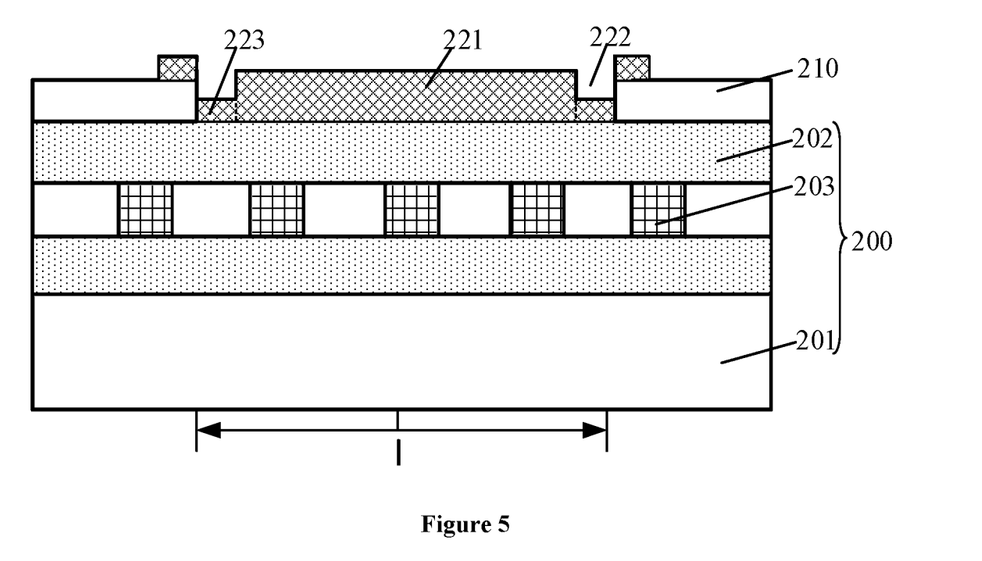

Returning to FIG. 12, after forming the first initial solder pad, a main body solder pad, one or more affixed solder pads and trenches may be formed (S103). FIG. 5 illustrates a schematic diagram of corresponding semiconductor structures.

Referring to FIG. 5, a portion of the thickness of the first initial solder pad 220 on the trench region B of the base substrate 200 may be removed to simultaneously form a main body solder pad 221 on the solder pad body region A of the base substrate 200, one or more affixed solder pads 223 and trenches 222.

The trenches 222 may be formed in the trench region B and between the passivation layer 210 and the main body solder pad 221. The bottom surface of each trench 222 on the base substrate 200 may be coplanar with the top surface of the solder pad body region A of the base substrate 200.

Each affixed solder pad 223 may be formed at the bottom of each trench 222 on the base substrate 200. A surface of each affixed solder pad 223 may be lower than the top surface of the main body solder pad 221. A process for removing a portion of the thickness of the first initial solder pad 220 on the trench regions B of the base substrate 200 may include a masked etching process.

In one embodiment, portions or the entire first initial solder pad 220 on the base substrate 200 around the solder pad body region A and the trench region B may be removed while removing a portion of the thickness of the first initial solder pad 220 on the trench region B of the base substrate 200. FIG. 5 illustrates a schematic removing portions of the first initial solder pad 220 on the base substrate 200 around the solder pad body region A and the trench region B.

When the isolation layer is formed, the isolation layer may be formed between the one or more affixed solder pads 223 and the trench region B of the base substrate 200, and between the main body solder pad 221 and the solder pad body region A of the base substrate 200.

In certain embodiments, the bottom surface of each trench on the base substrate may be coplanar with the top surface of the solder pad body region of the base substrate. The bottom of each trench may expose the surface of the trench region of the base substrate. Correspondingly, a method for forming the main body solder pad and the one or more trenches may include: forming the first initial solder pad on the solder pad body region and the trench region of the base substrate; removing the entire first initial solder pad on the trench region of the base substrate to simultaneously form the main body solder pad on the solder pad body region of the base substrate and the one or more trenches.

Before forming the first initial solder pad, the isolation layer may be formed on the solder pad body region and the trench region of the base substrate. Correspondingly, the isolation layer may be formed between the solder pad body region of the base substrate and the main body solder pad, and on the top surface of the trench region of the base substrate.

Figure 6:
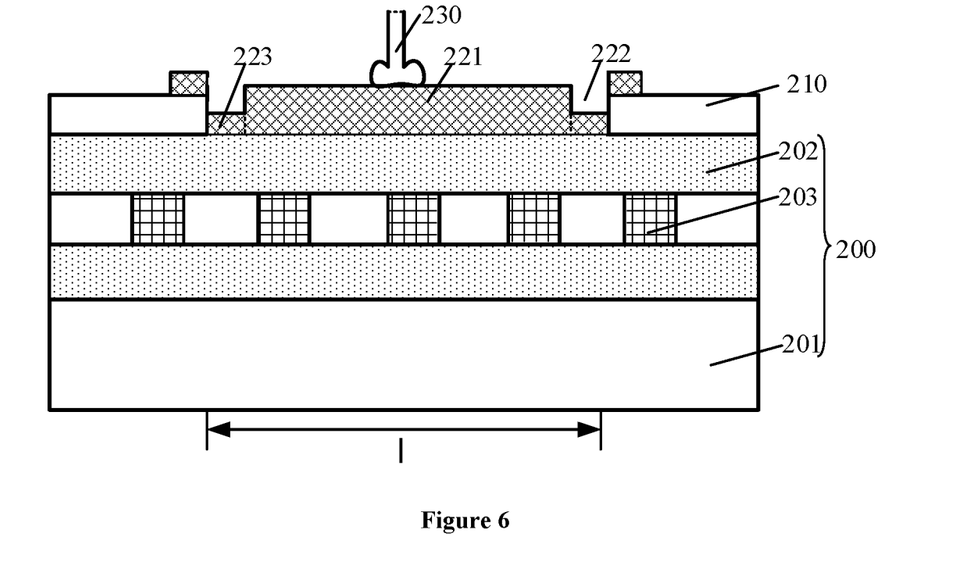

Returning to FIG. 12, after forming the main body solder pad, the one or more affixed solder pads and the trenches, a bonding conductive wire may be formed (S104). FIG. 6 illustrates a schematic diagram of corresponding semiconductor structures.

Referring to FIG. 6, a bonding conductive wire 230 may be formed by a wire bonding process. One end of the bonding conductive wire 230 may be connected to the main body solder pad 221. The bonding conductive wire 230 may be made of a metal material, such as copper, tungsten, aluminum, gold, or silver, etc. In one embodiment, the bonding conductive wire 230 may be made of copper.

In one embodiment, one end of the bonding conductive wire 230 may be connected to the main body solder pad 221. The other end of the bonding conductive wire 230 may be connected to an external packaging wire.

When performing the wire bonding process, the main body solder pad 221 may be subjected to a certain force to be extended into the surrounding region. When the bonding conducting wire 230 is made of a metal material having a high hardness, such as copper or gold, the wire bonding process may require a large energy. Therefore, when performing the wire bonding process, the main body solder pad 221 may be subjected to a large force, and the main body solder pad 221 may be extended to the surrounding region to a large extent.

Because the trench region B is provided on the base substrate 200 and around the main body solder pad 221, the trench region B of the base substrate 200 may have a large space for accommodating extended portion of the main body solder pad 221 due to deformation of the main body solder pad during the wire bonding process. Therefore, the main body solder pad 221 after deformation may be prevented from being extended to surrounding devices, and the occurrence of short circuit between the main body solder pad 221 and the surrounding devices may be avoided. When the number of the main body solder pads 221 is more than one, the occurrence of short circuit between the adjacent main body solder pads 221 may be avoided.

In addition, in the case where the area of the main body solder pad 221 for welding is satisfied, the one or more trenches 222 may be formed in the solder pad region I and around the main body solder pad 221. Therefore, the base substrate 200 outside of the solder pad region I may not need to be occupied.

Correspondingly, a packaging structure is also provided in the present disclosure. Referring to FIG. 6, the packaging structure may include a base substrate 200. The base substrate 200 may include a solder pad body region A (illustrated in FIG. 3) and a trench region B (illustrated in FIG. 3) around the solder pad body region A. The trench region B may be adjacent to the solder pad body region A. The packaging structure may also include a main body solder pad 221 on the solder pad body region A of the base substrate 200, and a bonding conductive wire 230. One end of the bonding conductive wire 230 may be connected to the main body solder pad 221. Details of the base substrate 200 may be referred to the corresponding descriptions in the above-described embodiments, and are not repeated herein.

The base substrate 200 may include one or more solder pad regions I. Each solder pad region I may include one solder pad body region A and one or more trench regions B around the solder pad body region A.

In certain embodiments, the base substrate may include one or more solder pad regions. Each solder pad region may include the solder pad body region. The trench region may be around the solder pad region.

The solder pad region I of the base substrate 200 may have a surface shape including one of a rectangular shape, a square shape, a circular shape, a triangular shape, and an irregular shape. For example, the rectangular may include two first sides facing toward each other and two second sides facing toward each other. The second sides may be connected to the first sides, respectively.

The solder pad body region A may include a contact region C (illustrated in FIG. 3). One end of the bonding conductive wire 230 may be connected to the main body solder pad 221 on the contact region C of the base substrate 200.

The contact region C may be the designed largest area in the process design where the main body solder pad 221 is in contact with the bonding conductive wire 230. In the actual process, the area where the main body solder pad 221 is in contact with the bonding conductive wire 230 may be within the contact region C or may be overlap with the contact region C.

In one embodiment, the contact region C of the base substrate 200 may have a circular surface shape. The surface of the contact region C of the base substrate 200 may be tangent to the first sides or the second sides. In one embodiment, the contact region C and the trench region B may be spaced apart by a minimum distance. The minimum distance may be in a range of approximately 1 µm-2 µm.

In addition, the packaging structure may include a passivation layer 210 formed on the surface of the base substrate 200. The passivation layer 210 may expose the solder pad body region A and the trench region B on the surface of the base substrate 200. In one embodiment, the passivation layer 210 may expose the surface of a top interconnection layer in the solder pad region I. Moreover, the packaging structure may include one or more trenches 222 formed on the trench region B. The trenches 222 may be formed between the passivation layer 210 and the main body solder pad 221. The bottom surface of each trench 222 on the base substrate 200 may be coplanar with the top surface of the solder pad body region A of the base substrate 200.

In one embodiment, the packaging structure may also include one or more affixed solder pads 223 formed at the bottom of each trench 222 on the base substrate 200. The surface of each affixed solder pad 223 may be lower than the top surface of the main body solder pad 221. In certain embodiments, the bottom of each trench may expose the surface of the trench region of the base substrate.

Further, the packaging structure may include an isolation layer (not illustrated) between the one or more affixed solder pads 223 and the trench region B of the base substrate 200, and between the main body solder pad 221 and the solder pad body region A of the base substrate 200.

In certain embodiments, the packaging structure may include the isolation layer, while may not include the one or more affixed solder pads 223. The isolation layer may be formed on the bottom surface of each trench 222 on the base substrate 200 and between the main body solder pad 221 and the solder pad body region A of the base substrate 200.

In the packaging structure consistent with disclosed embodiments, the trench region B of the base substrate 200 and adjacent to the solder pad body region A may have a large space for accommodating extended portion of the main body solder pad 221 due to deformation of the main body solder pad. Therefore, the main body solder pad 221 after deformation may be prevented from being extended to surrounding devices, and the occurrence of short circuit between the main body solder pad 221 and the surrounding devices may be avoided. When the number of the main body solder pads 221 is more than one, the occurrence of short circuit between the adjacent main body solder pads 221 may be avoided.

In addition, in the case where the area of the main body solder pad 221 for welding is satisfied, the one or more trenches 222 may be formed in the solder pad region I and around the main body solder pad 221. Therefore, the base substrate 200 outside of the solder pad region I may not need to be occupied.

Figure 13:
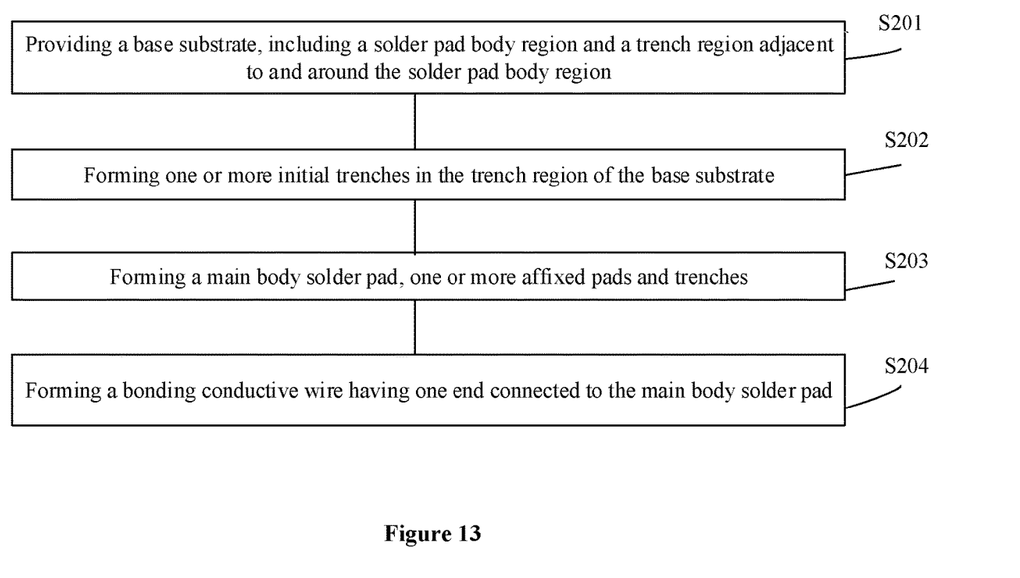
FIG. 13 illustrates another exemplary fabrication method for forming a packaging structure consistent with various disclosed embodiments of the present disclosure.

FIG. 13 illustrates another exemplary fabrication method for forming a packaging structure consistent with various disclosed embodiments of the present disclosure; and FIGS. 7-11 illustrate schematic diagrams of semiconductor structures corresponding to certain stages of the exemplary fabrication method.

One difference between the exemplary fabrication method illustrated in FIGS. 7-11 and the exemplary fabrication method illustrated in FIGS. 2-6 may include, that in one embodiment, the bottom surface of each trench in the base substrate may be lower than the top surface of the solder pad body region of the base substrate. One or more affixed solder pads may be formed on the bottom surface of the trenches in the base substrate when forming the main body solder pad and the trenches. The surface of each affixed solder pad may be lower than the top surface of the main body solder pad. In certain embodiments, the bottom surface of each trench in the base substrate may be lower than the top surface of the solder pad body region of the base substrate, and the bottom of each trench may expose the surface of each trench region of the base substrate. The same or similar features of the present exemplary fabrication method and the above-described exemplary fabrication method are not repeated herein.

In one embodiment, the bottom surface of each trench in the base substrate is lower than the top surface of the solder pad body region of the base substrate, and affixed solder pads are formed when forming the main body solder pad and the trenches as an example.

Figure 7:
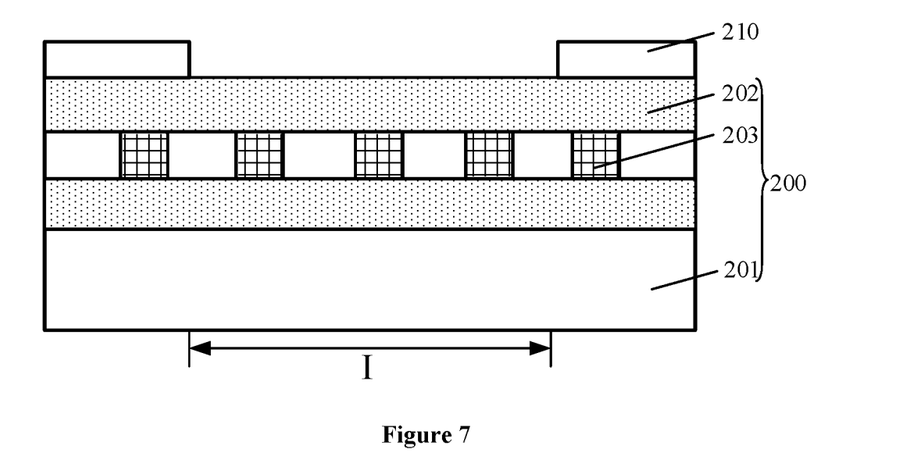
FIGS. 7-11 illustrate schematic diagrams of semiconductor structures corresponding to certain stages of another exemplary fabrication method for forming a packaging structure consistent with various disclosed embodiments of the present disclosure.
Figure 8:
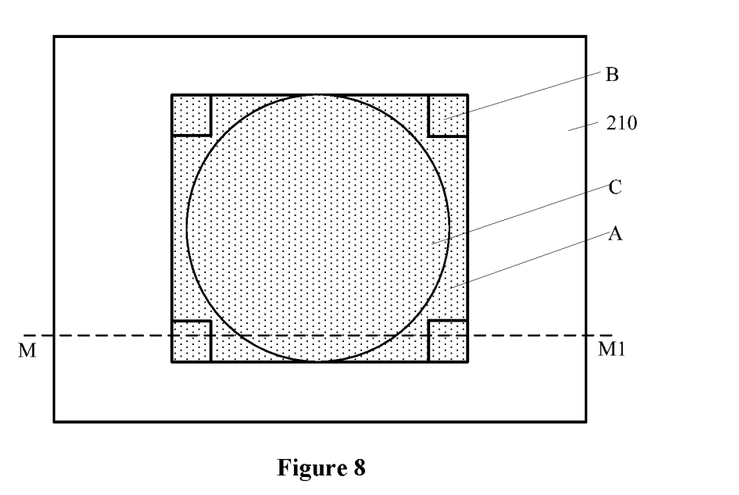

As shown in FIG. 13, at the beginning of the fabrication method, a base substrate with certain structures may be provided (S201). FIGS. 7-8 illustrate a corresponding schematic diagram.

FIG. 8 illustrates a top-view of a solder pad region I facing toward a top interconnection layer, and FIG. 7 illustrates a cross-sectional view along a line 'MM1' in FIG. 8. Referring to FIGS. 7-8, a base substrate 200 may be provided. The base substrate 200 may include one or more solder pad regions I. Each solder pad region I may include a solder pad body region A and a trench region B adjacent to the solder pad body region A. The solder pad body region A may include a contact region C. A passivation layer 210 may be formed on the surface of the base substrate 200. The passivation layer 210 may expose the solder pad body region A and the trench region B on the surface of the base substrate 200. Details of the base substrate can be referred to the corresponding descriptions associated with FIGS. 2-3, and are not repeated herein.

Figure 9:
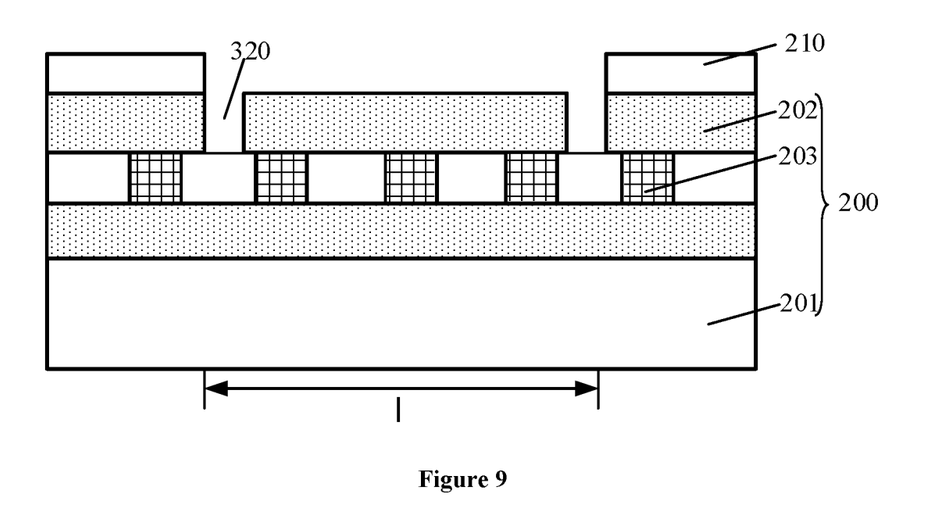

Returning to FIG. 13, after providing the base substrate, one or more initial trenches may be formed (S202). FIG. 9 illustrates a corresponding schematic diagram.

FIG. 9 illustrates a schematic diagram on the basis of FIG. 7. Referring to FIG. 9, one or more initial trenches 320 may be formed in the trench regions B of the base substrate 200 (illustrated in FIG. 8). A process for forming the initial trenches 320 may include a masked etching process. In one embodiment, each initial trench 320 may penetrate portions of the base substrate. For example, each initial trench 320 may penetrate through the top interconnection layer.

Figure 10:
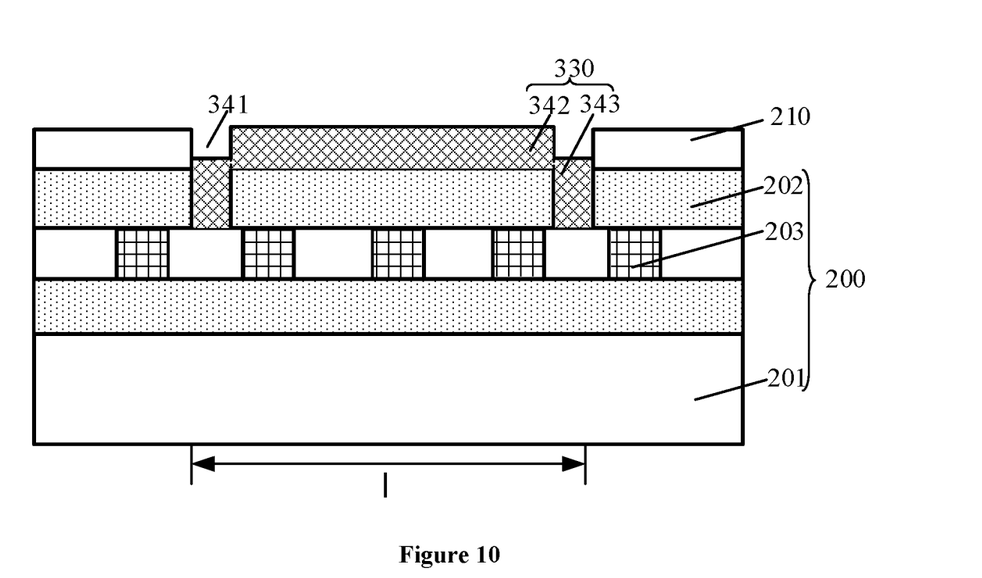

Returning to FIG. 13, after forming the initial trenches, a main body solder pad, one or more affixed solder pads, and one or more trenches may be formed (S203). FIG. 10 illustrates a corresponding schematic diagram.

Referring to FIG. 10, a second initial solder pad 330 may be formed in the one or more initial trenches 320 (illustrated in FIG. 9) and on the solder pad body region A of the base substrate 200 (illustrated in FIG. 8). The second initial solder pad 330 may include a main body solder pad 342 and one or more affixed solder pads 343. One or more trenches 341 may be formed while forming the main body solder pad 342 and the one or more affixed solder pads 343.

A process for forming the second initial solder pad 330 may include a deposition process, such as a sputtering process. The second initial solder pad 330 may be formed on the base substrate around the solder pad body region A and the trench regions B. After forming the second initial solder pad 330, portions or the entire second initial solder pad 330 on the base substrate around the solder pad body region A and the trench region B may be removed.

The main body solder pad 342 may be formed on the solder pad body region A of the base substrate (illustrated in FIG. 8). The one or more trenches 341 may be formed in the trench region and between the passivation layer 210 and the main body solder pad 342. The bottom surface of each trench 341 on the base substrate 200 may be lower than the top surface of the solder pad body region A of the base substrate 200.

In one embodiment, each affixed solder pad 343 may be formed at the bottom surface of each trench 341 on the base substrate 200. The surface of each affixed solder pad 343 may be lower than the top surface of the main body solder pad 342.

When the bottom surface of each trench 341 on the base substrate 200 is lower than the top surface of the solder pad body region A of the base substrate 200, the top surface of each affixed solder pad 343 may be above, lower than, or coplanar with the top surface of the solder pad body region A of the base substrate 200.

When the top surface of each affixed solder pad 343 is above the top surface of the solder pad region I of the base substrate 200, the top interconnection layer may not be exposed to prevent the top interconnection layer from being affected by water vapor in the air.

In one embodiment, an isolation layer may be formed between the one or more affixed solder pads 343 and the trench region B of the base substrate 200, and between the main body solder pad 342 and the solder pad body region A of the base substrate 200. The materials, structure, thickness and functions of the isolation layer can be referred to the corresponding descriptions in the above embodiments.

In certain embodiments, the bottom surface of each trench on the base substrate may be lower than the top surface of the solder pad body region of the base substrate, and the bottom of each trench may expose the surface of the trench region of the base substrate. Correspondingly, a method for forming the trenches and the main body solder pad may include: forming the initial trenches in the trench region of the base substrate; forming the second initial solder pad in the initial trenches and on the solder pad body region of the base substrate; and removing the second initial solder pad in the trench region to simultaneously form the main body solder pad and the trenches.

Before forming the second initial solder pad, the isolation layer may be formed on the solder pad body region and the trench region of the base substrate. Correspondingly, the isolation layer may be formed at the bottom surface of each trench on the base substrate, and between the solder pad body region of the base substrate and the main body solder pad.

Figure 11:
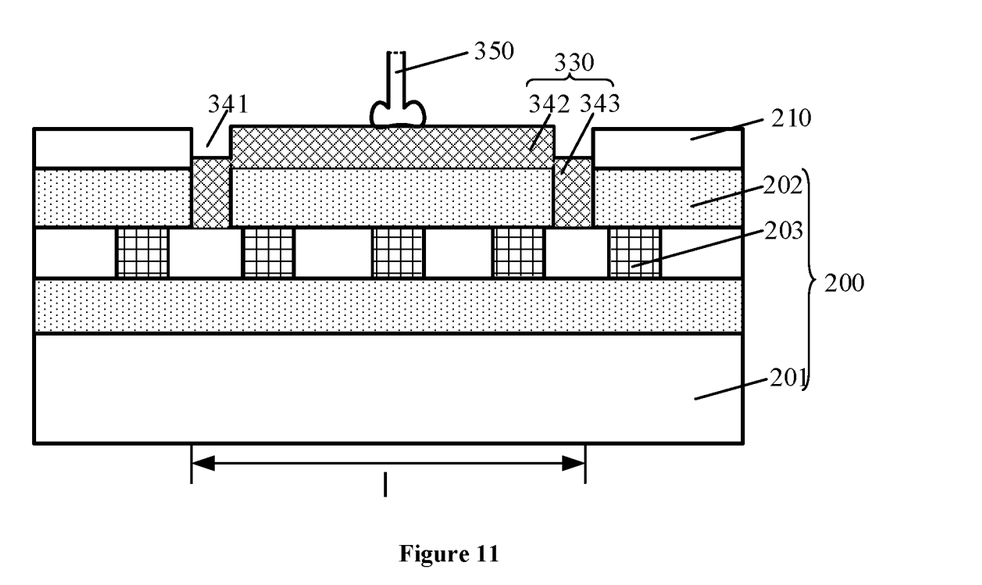

Returning to FIG. 13, after forming the main body solder pad, the affixed solder pads, and the trenches, a bonding conductive wire may be formed (S204). FIG. 11 illustrates a corresponding schematic diagram.

Referring to FIG. 11, a bonding conductive wire 350 may be formed by a wire bonding process. One end of the bonding conductive wire 350 may be connected to the main body solder pad 342. The material and functions of the bonding conductive wire 350 can be referred to the corresponding descriptions in the above embodiments.

When performing the wire bonding process, the main body solder pad 342 may be subjected to a certain force to be extended into the surrounding region. When the bonding conducting wire 350 is made of a metal material having a high hardness, such as copper or gold, the wire bonding process may require a large energy. Therefore, when performing the wire bonding process, the main body solder pad 342 may be subjected to a large force, and the main body solder pad 342 may be extended into the surrounding region to a large extent.

Because the trench region B is provided on the base substrate 200 and around the main body solder pad 342, the trench region B of the base substrate 200 may have a large space for accommodating extended portion of the main body solder pad 342 during the wire bonding process. Therefore, the main body solder pad 342 after deformation may be prevented from being extended into surrounding devices, and the occurrence of short circuit between the main body solder pad 342 and the surrounding devices may be avoided. When the number of the main body solder pads 342 is more than one, the occurrence of short circuit between the adjacent main body solder pads 342 may be avoided.

In addition, in the case where the area of the main body solder pad 342 for welding is satisfied, the one or more trenches 341 may be formed in the solder pad region I and around the main body solder pad 342. Therefore, the base substrate 200 outside of the solder pad region I may not need to be occupied.

Correspondingly, another packaging structure is also provided in the present disclosure. Referring to FIG. 11, the packaging structure may include a base substrate 200. The base substrate 200 may include a solder pad body region A (illustrated in FIG. 8) and a trench region B (illustrated in FIG. 8) around the solder pad body region A. The trench region B may be adjacent to the solder pad body region A. The packaging structure may also include a main body solder pad 342 on the solder pad body region A of the base substrate 200, and a bonding conductive wire 350. One end of the bonding conductive wire 350 may be connected to the main body solder pad 342. Details of the base substrate 200 may be referred to the corresponding descriptions in the above-described embodiments, and are not repeated herein.

The base substrate 200 may include one or more than one solder pad regions I. Each solder pad region I may include one solder pad body region A and one or more than one trench regions B around the solder pad body region A.

In certain embodiments, the base substrate may include one or more than one solder pad regions. Each solder pad region may include the solder pad body region. The trench region may be around each solder pad region.

The solder pad region I of the base substrate 200 may have a surface shape including one of a rectangular shape, a square shape, a circular shape, a triangular shape, and an irregular shape. In one embodiment, the solder pad region I of the base substrate 200 may have a rectangular surface shape. For example, the rectangular surface may include two first sides facing toward each other and two second sides facing toward each other. The second sides may be connected to the first sides, respectively.

The solder pad body region A may include a contact region C (illustrated in FIG. 8). One end of the bonding conductive wire 350 may be connected to the main body solder pad 342 on the contact region C of the base substrate 200.

The contact region C may be the designed largest area in the process design where the main body solder pad 342 is in contact with the bonding conductive wire 350. In the actual process, the area where the main body solder pad 342 is in contact with the bonding conductive wire 350 may be within the contact region C or may be overlap with the contact region C.

In one embodiment, the contact region C of the base substrate 200 may have a circular surface shape. The surface of the contact region C of the base substrate 200 may be tangent to the first sides or the second sides.

In one embodiment, the contact region C and the trench region B may be spaced apart by a minimum distance. The minimum distance may be in a range of approximately 1 µm-2 µm.

In addition, the packaging structure may include a passivation layer 210 on the surface of the base substrate 200. The passivation layer 210 may expose the surface of the solder pad body region A and the trench region B of the base substrate 200. In one embodiment, the passivation layer 210 may expose the surface of a top interconnection layer in the solder pad region I. Moreover, the packaging structure may include one or more trenches 341 formed on the trench region B. The one or more trenches 341 may be formed between the passivation layer 210 and the main body solder pad 342. In one embodiment, the bottom surface of each trench 341 on the base substrate 200 may be lower than the top surface of the solder pad body region A of the base substrate 200.

In one embodiment, the packaging structure may also include affixed solder pads 343 at the bottom surface of each trench 341 on the base substrate 200. The surface of each affixed solder pad 343 may be lower than the top surface of the main body solder pad 342.

When the bottom surface of each trench 341 on the base substrate 200 is lower than the top surface of the solder pad body region A of the base substrate 200, the top surface of each affixed solder pad 343 may be above, lower than, or coplanar with the top surface of the solder pad body region A of the base substrate 200. In certain embodiments, the bottom of each trench may expose the surface of the trench region of the base substrate.

Further, the packaging structure may include an isolation layer between the one or more affixed solder pads 343 and the trench region B of the base substrate 200, and between the main body solder pad 342 and the solder pad body region A of the base substrate 200.

In certain embodiments, the packaging structure may include the isolation layer, while may not include the one or more affixed solder pads 343. The isolation layer may be formed at the bottom surface of each trench 341 on the base substrate 200 and between the main body solder pad 342 and the solder pad body region A of the base substrate 200.

In the packaging structure consistent with disclosed embodiments, the trench region B of the base substrate 200 and around the solder pad body region A may have a large space for accommodating extended portion of the main body solder pad 342 due to deformation of the main body solder pad. Therefore, the main body solder pad 342 may be prevented from being extended into surrounding devices after deformation, and the occurrence of short circuit between the main body solder pad 342 and the surrounding devices may be avoided. When the number of the main body solder pads 342 is more than one, the occurrence of short circuit between the adjacent main body solder pads 342 may be avoided.

In addition, in the case where the area of the main body solder pad 342 for welding is satisfied, the one or more trenches 341 may be formed in the solder pad region I and around the main body solder pad 342. Therefore, the base substrate 200 outside of the solder pad region I may not need to be occupied.

In the packaging structure consistent with disclosed embodiments, the base substrate may include the solder pad body region and the trench region around the solder pad body region, and the main body solder pad may be formed on the solder pad body region of the base substrate. The trench region of the base substrate and around the solder pad body region may have a large space for accommodating extended portion of the main body solder pad due to deformation of the main body solder pad. Therefore, the main body solder pad may be prevented from being extended into surrounding devices after deformation. The occurrence of short circuit between the main body solder pad and the surrounding devices may be avoided.

In the fabrication method for forming the packaging structure consistent with disclosed embodiments, the main body solder pad may be extended into surrounding region due to the squeeze action of the bonding conductive wire during the wire bonding process. The trench region of the base substrate and around the solder pad body region may have a large space for accommodating extended portion of the main body solder pad during the wire bonding process. Therefore, the main body solder pad may be prevented from being extended into surrounding devices after deformation. The occurrence of short circuit between the main body solder pad and the surrounding devices may be avoided.

The disclosed fabrication method may be used in a 40/28 nm wire bonding packaging process. The fabrication method may be adapted to current semiconductor processes without adjusting or using additional machine and material. The fabrication method in the present disclosure may effectively solve the issues of easy occurrence of short circuit between adjacent pads that have a small distance. No additional cost and time may be introduced.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a packaging structure, comprising:
    providing a base substrate, including a solder pad body region and a trench region adjacent to and around the solder pad body region;
    forming a passivation layer, on the base substrate and exposing the solder pad body region and the trench region;
    forming a main body solder pad, on the solder pad body region of the base substrate;
    forming one or more trenches, on the trench region of the base substrate and between the passivation layer and the main body solder pad, wherein the one or more trenches on the trench region of the base substrate isolate the main body solder pad from the passivation layer; and
    forming a bonding conductive wire, having one end connected to the main body solder pad.

2. The method according to claim 1, wherein:
    a bottom surface of each trench on the base substrate is lower than, or coplanar with a top surface of the solder pad body region of the base substrate, and exposes a surface of the trench region of the base substrate.

3. The method according to claim 2, wherein a method for forming the main body solder pad and the trenches includes:
    forming a first initial solder pad on the solder pad body region and the trench region of the base substrate; and
    removing the entire first initial solder pad on the trench region of the base substrate to simultaneously form the main body solder pad and the trenches.

4. The method according to claim 2, wherein a method for forming the main body solder pad and the trenches includes:
    forming one or more initial trenches in the trench region of the base substrate;
    forming a second initial solder pad in the initial trenches and on the solder pad body region of the base substrate; and
    removing the second initial solder pad in the initial trenches to simultaneously form the trenches and the main body solder pad.

5. The method according to claim 1, wherein:
    a bottom surface of each trench on the base substrate is lower than, or coplanar with a top surface of the solder pad body region of the base substrate.

6. The method according to claim 5, further including:
    forming one or more affixed solder pads, at the bottom surface of each trench on the base substrate and having a top surface lower than a top surface of the main body solder pad, when forming the main body solder pad and the trenches.

7. The method according to claim 6, wherein a method for forming the main body solder pad, the trenches, and the affixed solder pads includes:
    forming a first initial solder pad on the solder pad body region and the trench region of the base substrate; and
    removing portions of the first initial solder pad on the trench region of the base substrate to simultaneously form the main body solder pad, the affixed solder pads, and the trenches.

8. The method according to claim 6, wherein a method for forming the main body solder pad, the trenches, and the affixed solder pads includes:
    forming one or more initial trenches in the trench region of the base substrate; and
    forming a second initial solder pad in the initial trenches and on the solder pad body region of the base substrate, wherein the second initial solder pad includes the main body solder pad and the affixed solder pads, and the trenches are formed while forming the main body solder pad and the affixed solder pads.

9. The method according to claim 1, wherein:
    the base substrate includes one or more solder pad regions; and
    each solder pad region includes one solder pad body region and one or more trench regions around the solder pad body region.

10. The method according to claim 9, wherein:
    the solder pad region of the base substrate has a surface shape including one of a rectangular shape, a square shape, a circular shape, a triangular shape, and an irregular shape.

11. The method according to claim 10, wherein:
    the solder pad region of the base substrate has a rectangular surface shape;
    the rectangular surface includes two first sides facing toward each other and two second sides facing toward each other, wherein the second sides are connected to the first sides, respectively;
    the solder pad body region includes a contact region;
    the contact region of the base substrate has a circular surface shape; and
    the surface of the contact region of the base substrate is tangent to one of the first sides and the second sides.

12. A method for fabricating a packaging structure, comprising:
    providing a base substrate, including a solder pad body region and a trench region adjacent to and around the solder pad body region;
    forming a passivation layer, on a surface of the base substrate and exposing the solder pad body region and the trench region;
    forming a main body solder pad, on the solder pad body region of the base substrate;
    forming one or more trenches on the trench region of the base substrate and between the passivation layer and the main body solder pad; and
    forming a bonding conductive wire, having one end connected to the main body solder pad, wherein:

the solder pad body region includes a contact region;
the one end of the bonding conductive wire connected to the main body solder pad on the base substrate is in the contact region;
the contact region and the trench region are spaced apart by a minimum distance; and
the minimum distance is in a range of approximately 1-2 μm.

13. The method according to claim 12, wherein:
a bottom surface of each trench on the base substrate is lower than, or coplanar with a top surface the solder pad body region of the base substrate.

14. The method according to claim 13, wherein:
one or more affixed solder pads, at the bottom surface of the one or more trenches on the base substrate, wherein a top surface of each affixed solder pad is lower than a top surface of the main body solder pad.

15. The method according to claim 14, wherein:
when the bottom surface of each trench on the base substrate is lower than the top surface of the solder pad body region of the base substrate,
the top surface of each affixed solder pad is above, lower than, or coplanar with the top surface of the solder pad body region of the base substrate.

16. The method according to claim 12, wherein:
the base substrate includes one or more solder pad regions; and
each solder pad region includes one solder pad body region and one or more trench regions around the solder pad body region.

17. The method according to claim 16, wherein:
the solder pad region of the base substrate has a surface shape including one of a rectangular shape, a square shape, a circular shape, a triangular shape, and an irregular shape.

18. The method according to claim 17, wherein:
the solder pad region of the base substrate has a rectangular surface shape; and
the rectangular surface includes two first sides facing toward each other and two second sides facing toward each other, wherein the second sides are connected to the first sides, respectively.

19. The method according to claim 18, wherein:
the contact region of the base substrate has a circular surface shape; and
the surface of the contact region of the base substrate is tangent to one of the first sides and the second sides.

* * * * *